United States Patent
Kapoor et al.

(10) Patent No.: US 9,912,335 B2
(45) Date of Patent: Mar. 6, 2018

(54) CONFIGURABLE POWER DOMAIN AND METHOD

(71) Applicant: NXP B.V., Eindhoven (NL)

(72) Inventors: Ajay Kapoor, Eindhoven (NL); Kristof Blutman, Eindhoven (NL); Jose Pineda de Gyvez, Eindhoven (NL); Arnoud van der Wel, Vught (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/794,485

(22) Filed: Jul. 8, 2015

(65) Prior Publication Data
US 2017/0012627 A1   Jan. 12, 2017

(51) Int. Cl.
| | |
|---|---|
| *H03L 5/00* | (2006.01) |
| *H03K 19/0185* | (2006.01) |
| *G06F 1/32* | (2006.01) |
| *H03K 19/00* | (2006.01) |
| *H03K 19/0175* | (2006.01) |

(52) U.S. Cl.
CPC ... *H03K 19/018507* (2013.01); *G06F 1/3234* (2013.01); *H03K 19/0019* (2013.01); *H03K 19/0175* (2013.01)

(58) Field of Classification Search
CPC .............. G06F 1/3234; H03K 19/0019; H03K 19/018507
USPC ................... 327/306, 333; 326/61–62, 80–81
See application file for complete search history.

(56) References Cited

U.S. PATENT DOCUMENTS

| | | | |
|---|---|---|---|
| 5,867,040 A | 2/1999 | Fuse et al. | |
| 6,479,974 B2 | 11/2002 | Cohn et al. | |
| 6,600,679 B2 | 7/2003 | Tanzawa et al. | |
| 7,002,371 B2 | 2/2006 | Kase et al. | |
| 7,215,149 B1 * | 5/2007 | Andrews | H03K 3/356104 326/81 |
| 7,329,968 B2 | 2/2008 | Shepard et al. | |
| 7,982,498 B1 * | 7/2011 | Chen | H03K 3/35613 326/21 |

(Continued)

FOREIGN PATENT DOCUMENTS

EP    2482456 A2    8/2012

OTHER PUBLICATIONS

Extended European Search report for EP Patent Appln. No. 16175281 (dated Dec. 6, 2016).

(Continued)

*Primary Examiner* — Dinh T Le (57) ABSTRACT

Aspects of this disclosure are directed to level-shifting approaches with communications between respective circuits. As may be implemented in accordance with one or more embodiments characterized herein, a voltage level of communications passed between respective circuits are selectively shifted. Where the respective circuits operate under respective power domains that are shifted in voltage range relative to one another, the voltage level of the communications is shifted. This approach may, for example, facilitate power-savings for stacked circuits in which a low-level voltage of one circuit is provided as a high-level voltage for another circuit. When the respective circuits operate under a common power domain, the communications are passed directly between the respective circuits (e.g., bypassing any level-shifting, and facilitating fast communication).

20 Claims, 10 Drawing Sheets

(56) References Cited

U.S. PATENT DOCUMENTS

| | | | |
|---|---|---|---|
| 8,169,257 B2 | 5/2012 | Pelley | |
| 8,339,177 B2* | 12/2012 | Jarrar | H03K 19/018521 326/62 |
| 8,476,962 B2 | 7/2013 | Pelley | |
| 8,878,387 B1 | 11/2014 | Wong et al. | |
| 9,246,492 B1* | 1/2016 | Sood | H03K 19/17704 |
| 9,490,813 B2* | 11/2016 | Bowles | H03K 19/018507 |
| 2005/0077919 A1 | 4/2005 | Sowden et al. | |
| 2006/0119390 A1 | 6/2006 | Sutardja | |
| 2010/0259299 A1 | 10/2010 | Dennard et al. | |
| 2012/0256656 A1 | 10/2012 | Stirk et al. | |
| 2014/0300188 A1 | 10/2014 | Boezen | |
| 2014/0340142 A1 | 11/2014 | Wong et al. | |
| 2015/0346742 A1 | 12/2015 | Kapoor et al. | |
| 2017/0012628 A1 | 1/2017 | Blutman et al. | |

OTHER PUBLICATIONS

Rajapandian, S.; Shepard, Kenneth L.; Hazucha, P.; Karnik, T., "High-voltage power delivery through charge recycling," Solid-State Circuits, IEEE Journal of , vol. 41, No. 6, pp. 1400,1410, Jun. 2006.

Ueda, K.; Morishita, F.; Okura, S.; Okamura, L.; Yoshihara, T.; Arimoto, K., "Low-Power On-Chip Charge-Recycling DC-DC Conversion Circuit and System," Solid-State Circuits, IEEE Journal of , vol. 48, No. 11, pp. 2608,2617, Nov. 2013 Abstract Only.

Meyvaert, H.; Van Breussegem, T.; Steyaert, M., "A 1.65W fully integrated 90nm Bulk CMOS Intrinsic Charge Recycling capacitive DC-DC converter: Design & techniques for high power density," Energy Conversion Congress and Exposition (ECCE), 2011 IEEE , vol., No., pp. 3234,3241, Sep. 17-22, 2011.

Ismail, Yousr; Yang, Chih-Kong Ken, "A compact stacked-device output driver in low-voltage CMOS Technology," Circuits and Systems (ISCAS), 2014 IEEE International Symposium on , vol., No., pp. 1624,1627, Jun. 1-5, 2014 Abstract Only.

Junhua Liu; Le Ye; Zhixin Deng; Jinshu Zhao; Huailin Liao, "A 1.8V to 10V CMOS level shifter for RFID transponders," Solid-State and Integrated Circuit Technology (ICSICT), 2010 10th IEEE International Conference on , vol., No., pp. 491,493, Nov. 1-4, 2010 Abstract Only.

Moghe, Y.; Lehmann, T.; Piessens, T., "Nanosecond Delay Floating High Voltage Level Shifters in a 0.35 m HV-CMOS Technology," Solid-State Circuits, IEEE Journal of , vol. 46, No. 2, pp. 485,497, Feb. 2011doi: 10.1109/JSSC.2010.2091322.

Dong Pan; Li, H.W.; Wilamowski, B.M., "A low voltage to high voltage level shifter circuit for MEMS application," University/Government/Industry Microelectronics Symposium, 2003. Proceedings of the 15th Biennial , vol., No., pp. 128,131, Jun. 30-Jul. 2, 2003.

Serneels, B.; Steyaert, M.; Dehaene, W., "A High speed, Low Voltage to High Voltage Level Shifter in Standard 1.2V 0.13μm CMOS," Electronics, Circuits and Systems, 2006. ICECS '06. 13th IEEE International Conference on , vol., No., pp. 668,671, Dec. 10-13, 2006.

Mohammadi, Babak; Rodrigues, Joachim Neves, "A 65 nm single stage 28 fJ/cycle 0.12 to 1.2V level-shifter," Circuits and Systems (ISCAS), 2014 IEEE International Symposium on , vol., No., pp. 990,993, Jun. 1-5, 2014 Abstract Only.

* cited by examiner

CONFIGURABLE POWER DOMAIN AND METHOD

Aspects of various embodiments are directed to configurable power domain circuitry, which can be implemented for a variety of applications.

Power domains are implemented in a variety of manners, for various types of circuitry. For instance, different power domains may be used for operating different types of circuitry that desirably operate under different voltage ranges. In some instances, power domains are stacked to facilitate use (e.g., recycling) of power from one domain as it is passed to another domain at a lower power.

Level shifters may be used for interfacing between power domains in which different types of circuitry operate under different voltage ranges (e.g., between voltage rails at different voltage levels). In this context, level shifters may operate to receive an input signal from one power domain operating on one power level, shift the voltage level of the input signal, and pass the input signal, having its voltage level shifted on to another power domain.

While useful, many level-shifting circuits are susceptible to undesirable drawbacks. For instance, level shifters can be susceptible to undesirable operation if there is a ripple in supply voltage, or otherwise uneven supply voltage values for the two domains (e.g., capacitors may become inefficient). Further, various level shifters require large area (e.g., due to the use of a capacitor) and are prone to issues relating to signal slope (slew rate). Further, throughput of a system can be limited for level-shifting operation (e.g., due to delay between the input and the output of a level shifter cell).

These and other matters have presented challenges to efficiencies of power domain implementations, for a variety of applications.

Various example embodiments are directed to coupling respective power domains, under different operating conditions involving common or shifted voltage ranges.

Aspects of this disclosure are directed to level-shifting approaches with communications between respective circuits. As may be implemented in accordance with one or more embodiments characterized herein, a voltage level of communications passed between respective circuits are selectively shifted. Where the respective circuits operate under respective power domains that are shifted in voltage range relative to one another, the voltage level of the communications is shifted. This approach may, for example, facilitate power-savings for stacked circuits in which a low-level voltage of one circuit is provided as a high-level voltage for another circuit. When the respective circuits operate under a common power domain, the communications are passed directly between the respective circuits (e.g., bypassing any level-shifting, and facilitating fast communication).

Various embodiments are directed toward an apparatus having a first circuit that operates under a first power domain having a first voltage range, and a second circuit that operates under a second power domain having a second voltage range. An interface circuit is connected to the first circuit and to the second circuit, and operates in modes as follows. In a first mode, a voltage level of communications passed between the first circuit and the second circuit is converted. In a second mode, communications are passed directly between the first circuit and the second circuit at a common voltage level.

Another embodiment is directed to an apparatus having a first circuit that operates under a first power domain having a first voltage range, a second circuit that operates under a second power domain having a second voltage range, and a level shifter circuit that is connected to both the first circuit and the second circuit. The level shifter circuit detects voltage ranges of the first and second power domains and passes communications between the first and second circuits as follows. A voltage level of each communication received from one of the first and second circuits is converted to a voltage level of the other one of the first and second circuits in response to the detected voltage ranges being different, and the communication is provided to the other one of the first and second circuits thereafter. Communications are passed directly between the first and second circuits in response to the detected voltage ranges being the same.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving the implementation of power domains, and configuration thereof. In certain implementations, aspects of the present disclosure have been shown to be beneficial when used in the context of power domains that are tailored to particular power levels, and related efficiencies. In some embodiments, reconfigurable aspects facilitate operation under desired conditions in this regard, such as to operate in power-saving modes involving power recycling via stacking of two or more power domains, and corresponding operation in a high-throughput mode in which power domains are operated over common voltage ranges. Switching between these modes is effected based on operating characteristics. These and other aspects can be implemented to address challenges, including those discussed in the background above. While not necessarily so limited, various aspects may be appreciated through a discussion of examples using such exemplary contexts.

Various embodiments involve a circuit-stacking approach in which throughput penalty is reduced or minimized for a high-throughput mode and charge recycling is used in a low power mode. In the low power mode, charge from a higher-voltage circuit is recycled to a lower-voltage circuit during dynamic and static modes. Such embodiments may be used such that a single computing platform may operate in multiple applications, including those that may benefit from one or more of fast transitions between standby mode and a high-throughput mode, low standby current consumption, or complete shutdown between computations. Various embodiments involve configuring a power-domain of a full memory, part of memory, part of logic or part of memory and logic in these contexts.

A variety of applications involve level shifters that include transmitter, channel and receiver circuits. The transmitter handles signals coming from an input power domain, the channel interfaces between the input power domain and the output power domain, and the receiver provides signals to the output power domain. The transmitter may buffer the input signal and send it through the channel (e.g., as implemented with a chain of inverters). The channel may include a DC (direct current) path and an AC (alternating current) path. The DC path, which includes an inverter having its ground and power ports acting as an input and output, performs level translation of the input signal and provides the level-translated signal to the receiver side. This separates the two power domains and avoids overvoltage over what can be implemented as thin-oxide transistors in the transmitter and receiver. The AC path may address slow or power-consuming aspects of the DC path, and may include a large capacitor that couples the transmitter with the receiver and that ensures quick resolution or short metastability (thus decreasing delay and reducing power). The receiver, such as a latch or other bi-stable circuit, regenerates level-translated voltage values from the channel to provide a digitally valid output. In some implementations, delay and power consumption of the level shifter is dependent on the latch, which can be implemented with high-threshold voltage (hvt) devices while the transmitter is implemented with low-threshold voltage (lvt) devices, to compensate for weak coupling between the different power domains.

Various embodiments involve a bypass level-shifting approach in which a level shifter is bypassed under conditions in which level-shifting is not needed, and used under conditions in which level-shifting is desired. Such an approach can be implemented with low power designs using circuit-stacking, and mitigates related problems such as those discussed above. Accordingly, systems with two (or more) subparts can be configured into two primary configurations, such as by configuring respective power domains into flat (same power) and stacked (shifted power) configurations. An interface between these subparts operates in a flat mode in which minimal signal delay is incurred via passing signals between the subparts (e.g., without level-shifting), and in a stacked mode in which signals are passed between the subparts with level-shifting that adjusts the voltage (range) of the signals received from one of the subparts to a corresponding voltage at which the other one of the subparts operates. In the stacked mode, charge can be recycled between the respective subparts. In these contexts, the subparts can be implemented with one or more of a variety of different circuit types.

Another embodiment is directed to an apparatus having a first circuit that operates under a first power domain having a first voltage range, a second circuit that operates under a second power domain having a second voltage range, and a level shifter circuit that is connected to both the first circuit and the second circuit. The level shifter circuit detects voltage ranges of the first and second power domains and passes communications between the first and second circuits as follows. A voltage level of each communication received from one of the first and second circuits is converted to a voltage level of the other one of the first and second circuits in response to the detected voltage ranges being different, and the communication is provided to the other one of the first and second circuits thereafter. Communications are passed directly between the first and second circuits in response to the detected voltage ranges being the same.

In some stacked embodiments, the first power domain operates between a first high voltage level and a first low voltage level that is lower than the first high voltage level, and the second power domain operates between a second high voltage level and a second low voltage level that is lower than the second high voltage level. The level shifter circuit detects the voltage ranges of the first and second power domains by detecting that the first and second power domains operate over the same voltage range in response to the first low voltage level being unequal to the second high voltage level. The level shifter detects that the first and second power domains operate over different voltage ranges (shifted relative to one another) in response to first low voltage level being equal to the second high voltage level.

The level shifter operates in a variety of manners, to suit particular embodiments. In some embodiments, the level shifter operates in stacked and flat modes to respectively couple signals at different and at common voltage levels. In the stacked mode, the voltage level of communications is converted in response to the detected voltage ranges indicating that the first circuit operates between first and second voltage levels and that the second circuit operates between the second and a third voltage level. In the flat mode, communications are passed directly between the first and second circuits without converting the voltage level, in response to the detected voltage ranges indicating that both the first and second circuits operate between common voltage levels.

In some embodiments, the level shifter circuit first and second circuit paths, with the first circuit path including a voltage level shifting circuit that shifts a voltage level of the communication, and with the second circuit path providing an output (e.g., directly/bypassing the level shifting circuit). The first circuit path outputs communications with a shifted voltage level based on a comparison circuit detecting the voltage ranges of the power domains as being different. The second circuit path outputs communications at a voltage level at which the communications are received, in response to voltage ranges being detected as the same, via the comparison circuit or a different comparison circuit implemented with the second circuit (e.g., with each of the first and second circuits having its own comparison circuit).

In further embodiments, a multiplexer has first and second inputs respectively connected to receive the outputs of first and second circuit paths as noted above. The multiplexer provides an output signal based on the output of the first circuit path in response to the detected voltage ranges being different, and provides an output signal based on the output of the second circuit path in response to the detected voltage ranges being the same.

In some implementations, one or more embodiments noted above further includes a switching circuit that couples a low voltage rail of the first circuit to a high voltage rail of the second circuit in a first mode. In a second (flat) mode, the switching circuit couples a high voltage rail of the first circuit to the high voltage rail of the second circuit, and couples the low voltage rail of the first circuit to a low voltage rail of the second circuit.

In some embodiments, the level shifter circuit includes a range detection circuit that detects the voltage ranges of the first and second power domains, and a shift circuit that converts the voltage level of each communication. The level shifter circuit also includes a bypass circuit that provides communications for passing between the circuits at a common voltage level, and a multiplexer that selects an output of one of the shift circuit and the bypass circuit based on the voltage ranged detected by the range detection circuit.

Various embodiments are directed toward an apparatus having a first circuit that operates under a first power domain having a first voltage range, and a second circuit that operates under a second power domain having a second voltage range. An interface circuit is connected to the first circuit and to the second circuit, and operates in modes as follows. In a first mode, a voltage level of communications passed between the first circuit and the second circuit is converted. In a second mode, communications are passed directly between the first circuit and the second circuit at a common voltage level.

In some implementations, the first circuit operates between a first high power rail and a first low power rail that operates at a voltage level that is lower than a voltage level of the first high power rail, and the second circuit operates between a second high power rail and a second low power rail that operates at a voltage level that is lower than a voltage level of the second high power rail. The interface circuit operates in first and second modes as follows. In the first mode, the first low power rail is coupled to the second high power rail, thereby recycling power from the first circuit into the second circuit. In the second mode, the first high power rail is coupled to the second high power rail with the first low power rail coupled to the second low power rail, thereby operating the first circuit and the second circuit over a common voltage range.

Operation as above may, for example, be carried out respectively in stacked and flat modes. In the stacked mode, the voltage level of the communications is carried out in response to the first circuit operating between first and second voltage levels and the second circuit operating between the second voltage level and a third voltage level, with the second voltage level being between the first and third voltage levels. In the flat mode, the communications are passed directly between the first and second circuits without converting the voltage level of the communication (where both the first and second circuits operating over a common voltage range). In certain implementations, the interface circuit includes a first circuit path coupled to receive the communications from one of the first and second circuits, and a second circuit path coupled to receive the communications from one of the first and second circuits. The first circuit path includes a first comparison circuit and a voltage level shifting circuit that outputs the communications with a shifted voltage level to the other one of the first and second circuits. The second circuit path includes a second comparison circuit that outputs the communications to the other one of the first and second circuits at a voltage level at which the communication is received. In certain implementations, the interface circuit outputs the communications with a shifted voltage level in response to the first and second voltage ranges being different, and outputs the communications at a voltage level at which the communications are received in response to the first and second voltage ranges being the same.

Various method-based embodiments are carried out in accordance with one or more apparatuses as characterized herein, such as with the respective first and second modes as noted above. Level-shifting is carried out to provide communications between domains operating over the same or different voltage ranges. Certain aspects involve detecting voltage levels and/or ranges of respective domains, and converting the voltage level of signals passed therebetween for those exhibiting different ranges. Level-shifting circuitry (and associated delay) can be bypassed for passing flat communications between domains operating over a common voltage range.

Figure 1:
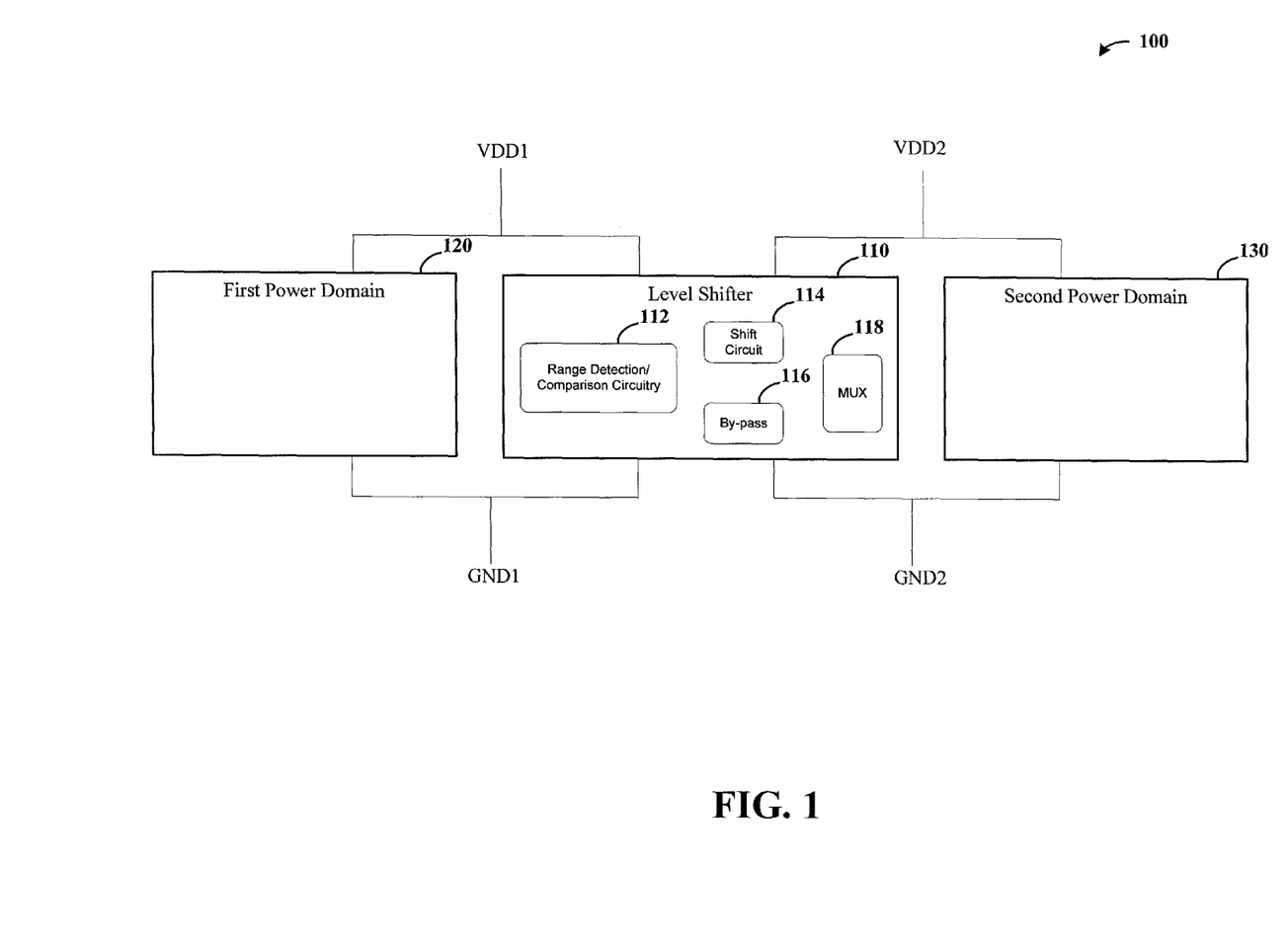
FIG. 1 shows an apparatus, as may be implemented in accordance with one or more embodiments.

Turning now to the figures, FIG. 1 shows an apparatus 100, as may be implemented in accordance with one or more embodiments. The apparatus 100 includes level shifter circuitry 110 that operates to communicate signals between first power domain circuitry 120 and second power domain circuitry 130. Each of the power domains is coupled between respective power rails depicted as VDD and GND (e.g., a reference voltage level), with the first power domain operating between VDD1 and GND1, and the second power domain operating between VDD2 and GND2. Such an approach may be implemented with a variety of power domains and related circuit types, such as with embodiments in which the first power domain 120 is implemented with logic circuitry and second power domain 130 is implemented with memory circuitry.

In various implementations, the level shifter 110 operates to actively control the coupling of VDD1 to GND2 for a stacked mode, or the coupling of VDD2 to GND1 for another stacked mode. For a level mode, the level shifter 110 couples VDD1 to VDD2, and GND1 to GND2.

In some implementations, the level shifter 110 includes range detection/comparison circuitry 112 that operates to detect respective voltage levels/ranges of each power domain, and to control the operation of the level shifter in respective modes that are based on the detection. For instance, the respective power domains may be stacked with VDD1 high, GND1 and VDD2 coupled at a mid-level, and GND2 low. Under such a stacked condition, the range detection/comparison circuitry 112 detects the respective rail levels as being different, and operates to engage level-shifting circuitry. This detection and related implementation of level-shifting circuitry may, for example, be carried out autonomously or otherwise independent from any control signal. Where the respective power domains are flat or otherwise operated at a common voltage range, the range detection/comparison circuitry 112 operates such that signals are passed between the power domains without level-shifting, bypassing the level-shifting circuitry.

In some embodiments, the level shifter 110 includes a shift circuit 114 and a bypass circuit 116 that respectively operate to shift the level of signals passed between the power domains, or bypass the shift circuit such that the level of the signals is not shifted. Further, a multiplexer 118 may be employed to multiplex the respective circuit paths including the shift circuit 114 and the bypass circuit 116, as may be controlled or otherwise operated in accordance with the range detection/comparison circuitry 112.

As may be implemented in connection with FIG. 1 and/or with other level detection approaches and circuitry characterized herein, one or more embodiments employ a detection approach as follows. Using the circuitry depicted in FIG. 1 as an example, when VDD1=VDD2 and GND1=GND2, a flat mode is detected as both power domains operating over a common voltage range. When VDD1=GND2 and VDD2=VDD1+voltage of the second power domain, a stacked mode is detected. Various embodiments may facilitate detection of a stacked mode when VDD1=GND2 (with VDD2 being a higher voltage), or when VDD2=GND1 (with VDD1 being a higher voltage). Other embodiments may involve a comparison of VDD1 with VDD2, with a stacked architecture detected when the levels are different.

Figure 2:
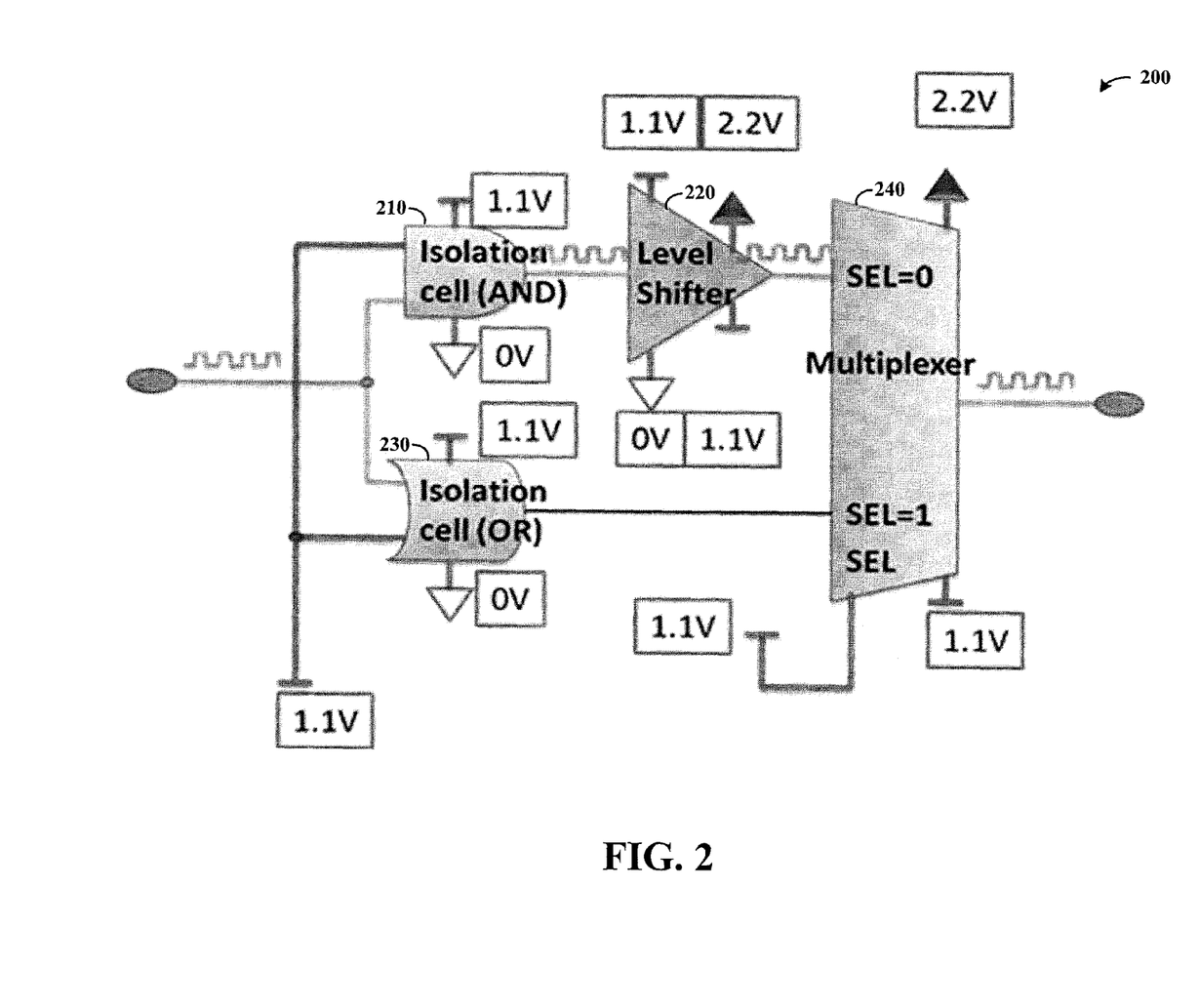
FIG. 2 shows a circuit in which a stacked mode is implemented with level-shifting circuitry, in accordance with other embodiments.
Figure 3:
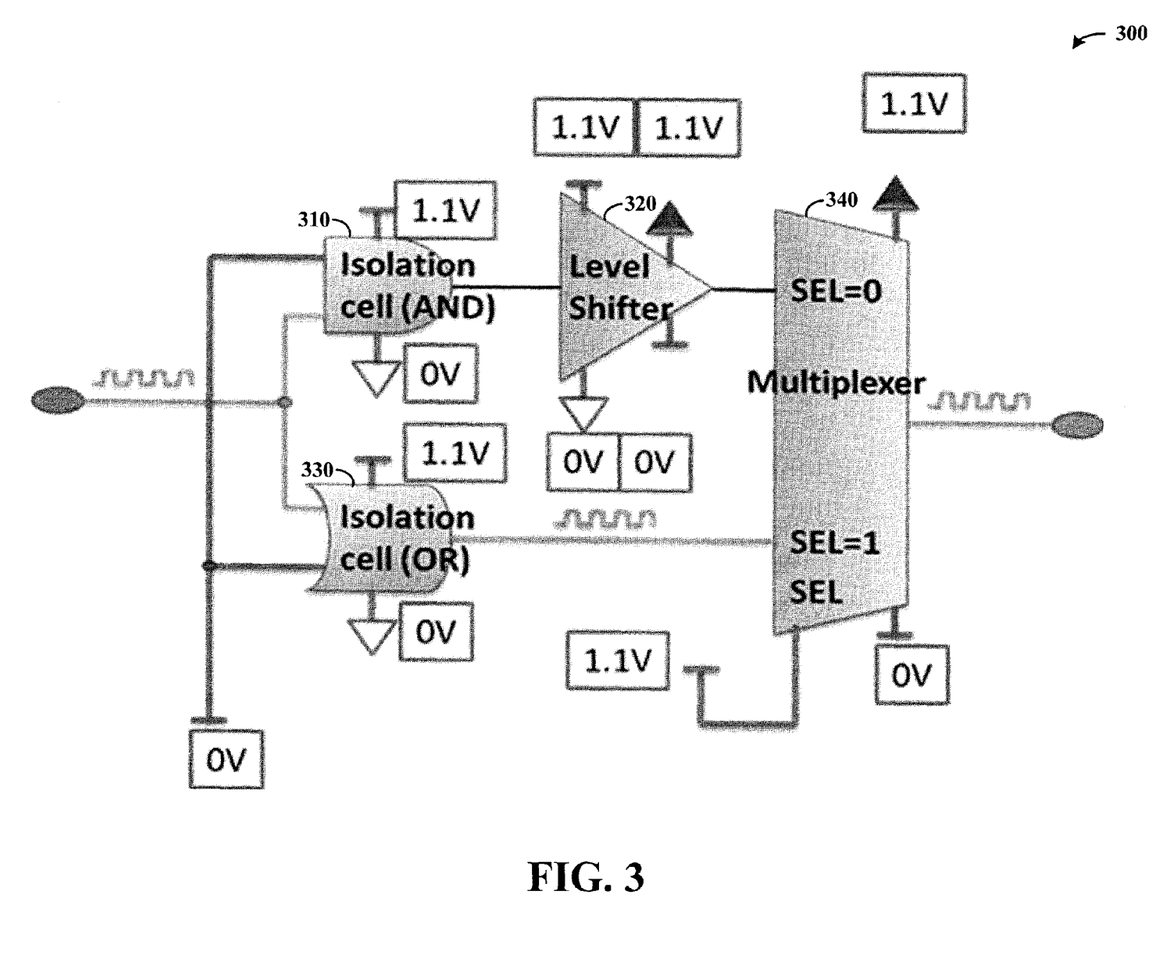
FIG. 3 shows a circuit in which a flat mode is implemented, in accordance with one or more embodiments.

FIG. 2 shows a circuit 200, in which a stacked mode is implemented with level-shifting circuitry, in accordance with an example embodiment. Similarly, FIG. 3 shows a circuit 300, in which a flat mode is implemented. Various voltage levels are shown by way of example. The circuit 200 includes a circuit 210 (e.g., an isolation AND circuit or other comparison circuit) and a level shifter 220 in a first circuit path, and a circuit 230 (e.g., an isolation (OR) cell or other comparison circuit) in a second circuit path. Each circuit path is connected to a multiplexer 240, which selects between the circuit paths for providing an output. The circuit 300 similarly includes a circuit 310 (e.g., an AND cell) and a level shifter 320 in a first circuit path, and circuit 330 (e.g., an isolation (OR) cell) in a second circuit path, both of which are connected to multiplexer 340. The respective circuits 200 and 300 may be implemented in a common circuit for respective modes.

By way of example, a 1.1 V voltage range is shown for respective power domains (e.g., VDD1 at 2.2V, GND1 at 1.1V, and VDD2 at 1.1V, GND2 at 0V), in which translation between voltage levels of domains in a stacked mode and a bypass mode are provided. In a stacked mode, an output of level shifter 220 is selected via circuit 210 as an AND circuit. In a flat mode, a bypass circuit is selected via circuit 330. This selection can be done without using external control signals.

In some implementations, to control the circuits 310 and 330 (e.g., as isolation cells) as well as the multiplexer 340, the voltage information of the opposite domain is used. For instance, a power rail of a bottom power domain for the multiplexer 340 can be used with a ground rail of the power domain for the isolation cells. If the circuit is in stacked mode, the multiplexer 340 receives a 1.1V bottom supply voltage on its select input. This equals a ground voltage for the top/high power domain, so the level shifter data input (since SEL=0) is selected. On the other hand, when the circuit is in a flat mode, the select signal is still at 1.1 V, which equals a logical one value since the top/high domain is between 0V and 1.1 V under which conditions the bypass path is selected.

In a stacked mode, the ground rail of the top/high power domain is 1.1 V and provides a logical '1' in the bottom/low power domain (0-1.1V). The circuit 230 forces an output to 1.1V, while the circuit 210 is sensitive to the input signal level and buffers it for the level shifter input. Thus the level shifter receives the input signal and converts it to the desired voltage levels.

In a flat mode, the ground voltage of the top/high power domain that controls the two isolation cells is at 0V, which is a logical '0' in the bottom/lower power domain (also 0-1.1V in flat mode). A logical '0' will force the output of the circuit 310 to 0V while enabling the circuit 330 (e.g., an OR isolation cell) to bypass the signal to the multiplexer 340.

Figure 4:
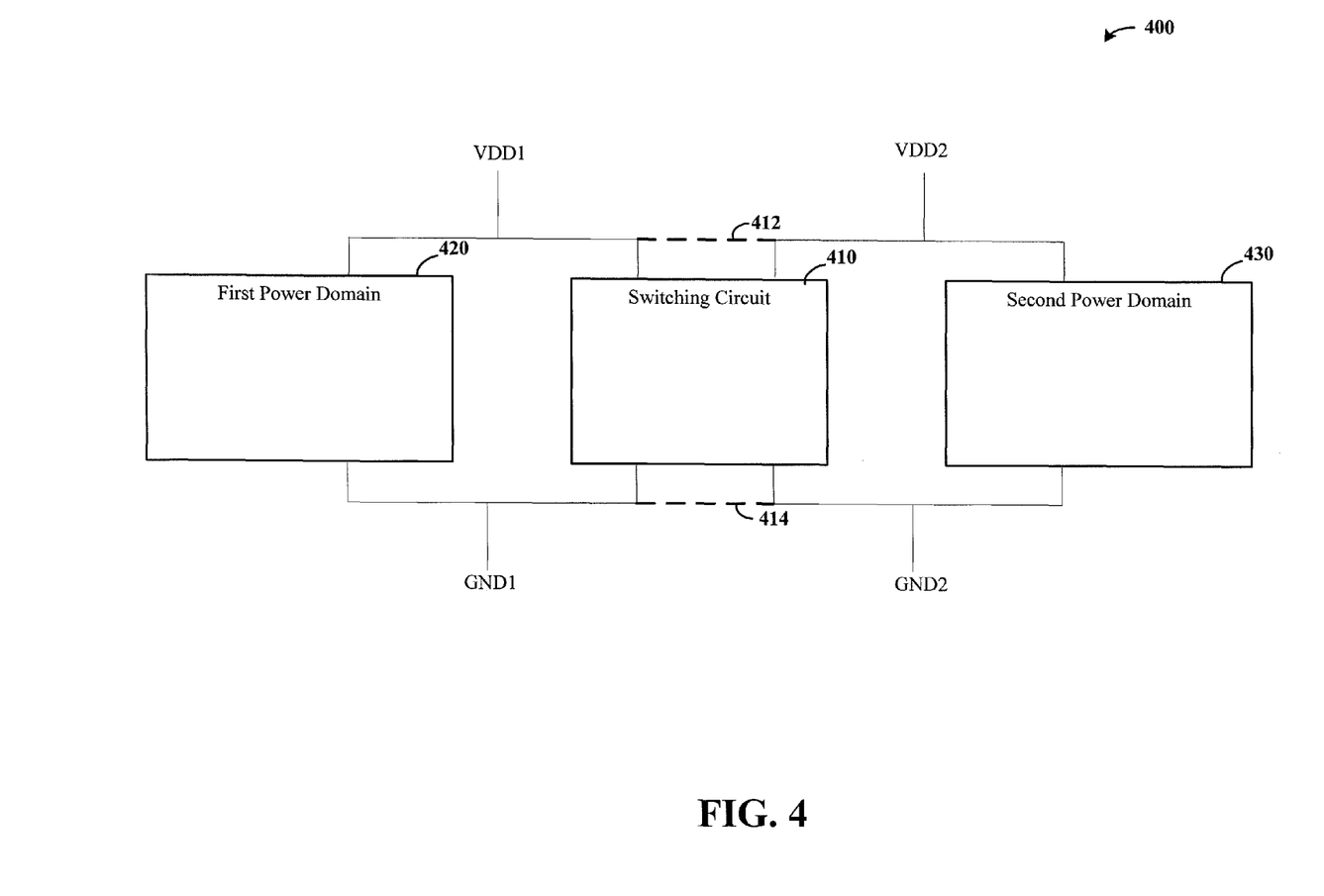
FIG. 4 shows a circuit that selectively connects power domains in a flat mode, in accordance with one or more embodiments.

Referring to FIG. 4, a circuit 400 is shown with a switching circuit 410 that operates to selectively connect first power domain 420 with second power domain 430 (e.g., similar to that shown in FIG. 1) in a flat mode. The switching circuit 410 effects a connection between VDD1 and VDD2 shown by dashed lines 412 and 414.

Figure 5:
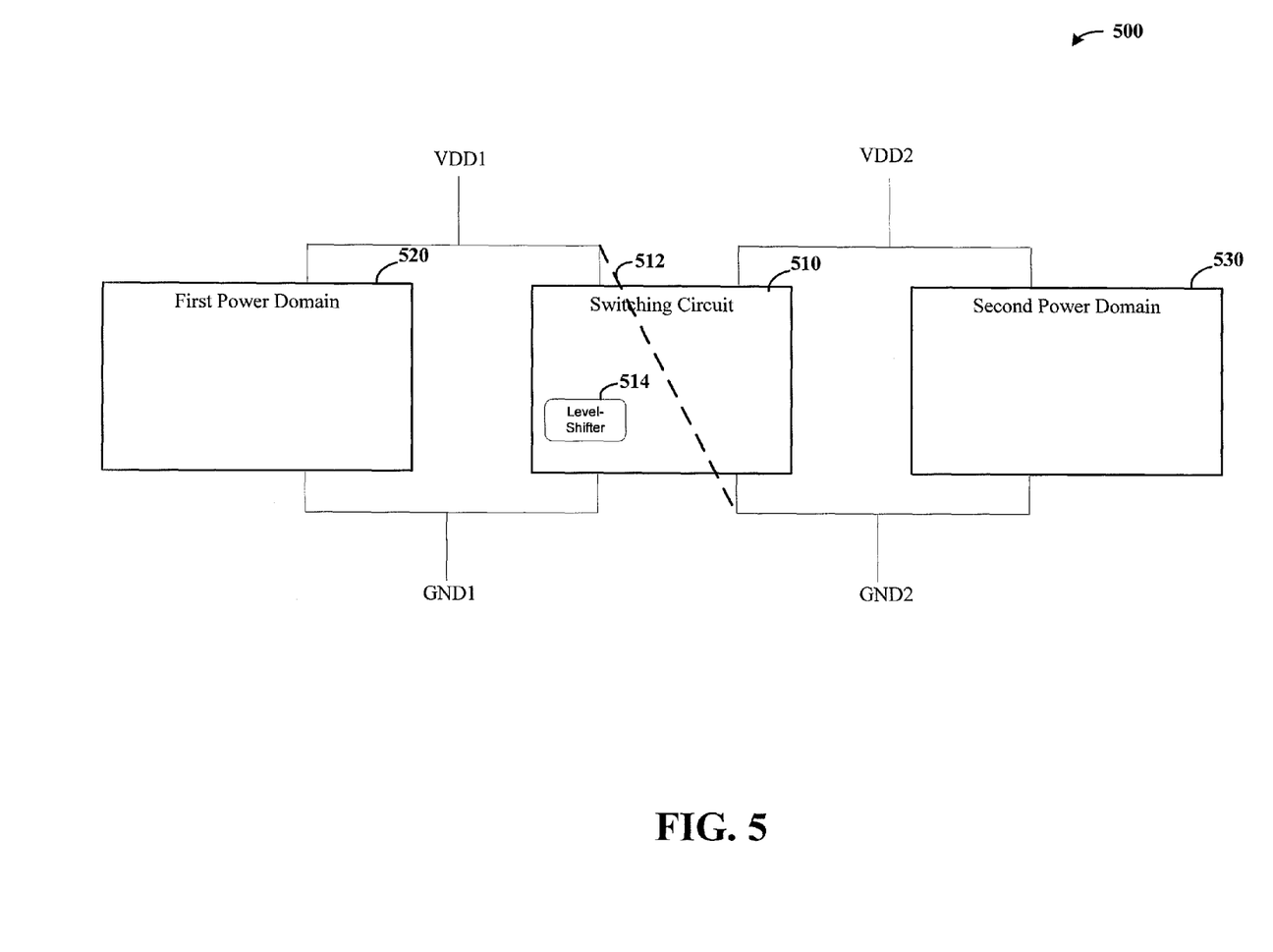
FIG. 5 shows a circuit that selectively connects power domains in a stacked mode, in accordance with one or more embodiments.

FIG. 5 shows a circuit 500 that is similar to the circuit 400 in FIG. 4, with a switching circuit 510 that selectively connects first power domain 520 with second power domain 530 in a stacked mode. VDD1 is connected to GND2, as represented by dashed line 512. In this implementation, the switching circuit 510 may include a level shifter 514 that operates to shift the voltage level of signals passed between the power domains, such as described herein. In some implementations, the level shifter 514 operates as a up-level shifter and for an input signal received between GND1 and VDD1, converts the signal to a signal between GND2 and VDD2. In other implementations, the level shifter 514 operates as a down-level shifter and, for an input signal received between GND2 and VDD2, converts the signal into a signal between GND1 and VDD 1.

Table 1 below provides various operating modes as may be implemented, for example, with the circuits shown in FIGS. 1, 3 and 4. Certain embodiments employ other operating modes. In some implementations, mode-transition times (e.g., from a sleep mode to high computing mode) can be used in accordance with power-saving requirements, relative to wake-up timing. For example, if faster wakeup-time is desired for a high-throughput mode, a sleep mode can be used. If computing is carried out in a high-throughput mode but low standby current is required, a light sleep1 mode, as shown below, can be implemented. Transitions from flat configurations to stacked configurations (and vice versa) may take more time than transitions from an active mode to a sleep mode, and back to an active mode for a common configuration.

TABLE 1

| | | | Logic | | Memory | | Signal Interfacing |
|---|---|---|---|---|---|---|---|
| | Mode | Configuration | GND | Power | GND | Power | Type |
| Active | High-throughput | Flat | 0 | $V_{DD}$ | 0 | $V_{DD}$ | bypass |
| | Med- | Stack | 0 | $V_{DD}$ | $V_{DD}$ | $V_{DD}$ + | Level - |

TABLE 1-continued

| | Mode | Configuration | Logic GND | Logic Power | Memory GND | Memory Power | Signal Interfacing Type |
|---|---|---|---|---|---|---|---|
| | throughput Low throughput | Stack | 0 | $V_{DD\_min}$ | $V_{DD\_min}$ | $V_{mem}$ $V_{DD\_min} + V_{mem\_min}$ | shifting Level-shifting |
| Sleep | Light sleep | Flat | 0 | $V_{Ret}$ | 0 | $V_{DRV}$ | Power gate |
| | Light sleep1 | Stack | 0 | $V_{Ret}$ | $V_{Ret}$ | $V_{Ret} + V_{DRV}$ | Power gate |
| | Light sleep2 | Stack | 0 | 0 | | Half Mem-stack | Power gate |

Figure 6:
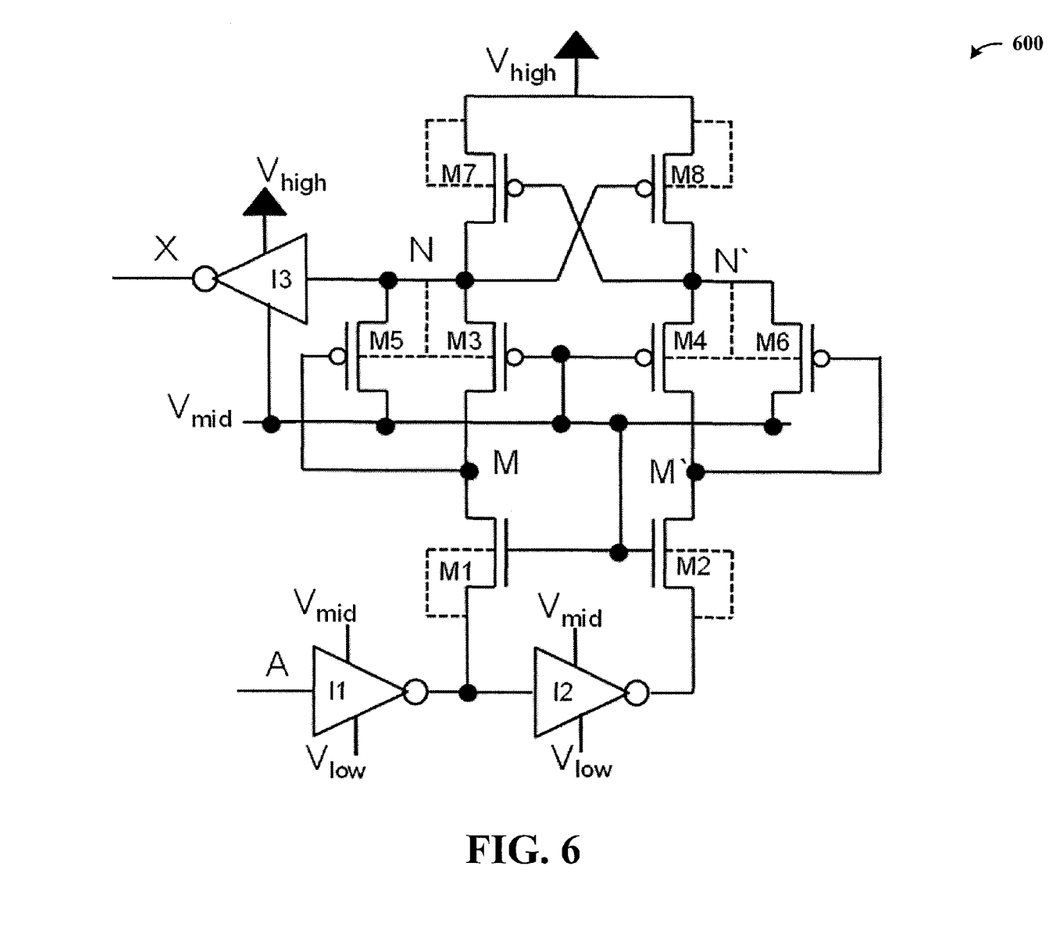
FIG. 6 shows a circuit that may be implemented with one or more level-shifting implementations, in accordance with another example embodiment.

FIG. 6 shows a level shifter apparatus 600, in accordance with another example embodiment. By way of example, the schematic is shown as implemented for signal conversion from a bottom domain to a top domain, with the understanding that a complementary circuit may be implemented for signal conversion from a top to a bottom domain. Inverters I1 and I2 are in the bottom voltage domain while transistors (e.g., PMOS) M7, M8 and inverter I3 are in the top voltage domain. Transistors M1-M6 are shared between the top and bottom domains.

The level shifter apparatus 600 may operate to suit particular embodiments, and may be implemented for level-shifting as discussed herein (e.g., with shift circuit 114 in FIG. 1). In various implementations, the '1' (high) logic value of bottom domain has the same voltage level as '0' (low) of the top domain, represented by $V_{mid}$. Signals are transferred between domains as follows. For an initial signal 'A' and 'X' are at respective '0' (low) logic values, nodes M, N are '1' (high) and M', N' are '0' (low). When signal 'A' changes state, (e.g., goes from '0' (low) to '1' (high) logic value), the output of I1 goes to '0' (low), and the output of I2 goes to '1' (high) of the bottom voltage domain. Therefore, M1 starts conducting and M2 is turned off. This leads to node-M being pulled '0' (low), thereby turning on the M5, which pulls node-N towards $V_{mid}$. At some point during this transition, M3 also starts conducting, pulling node-N down. This leads to flipping the state of a latch made by M7, M8 (positive feedback), meaning node-N will settle to '0' (low) {=$V_{mid}$} and node-N' settles to '1' (high) {=$V_{high}$}. Thus, 'X' goes to '1' (high) and the transition is complete. The reverse happens during '1' (high) to '0' (low) logic transition. During the transition, state of latch is flipped by the pull-down action of either M1, M3 and M5 competing with M7, or by M2, M4 and M6 competing with M8. In this context, the dimensioning of these transistors can be set to achieve desirable operation.

Figure 7:
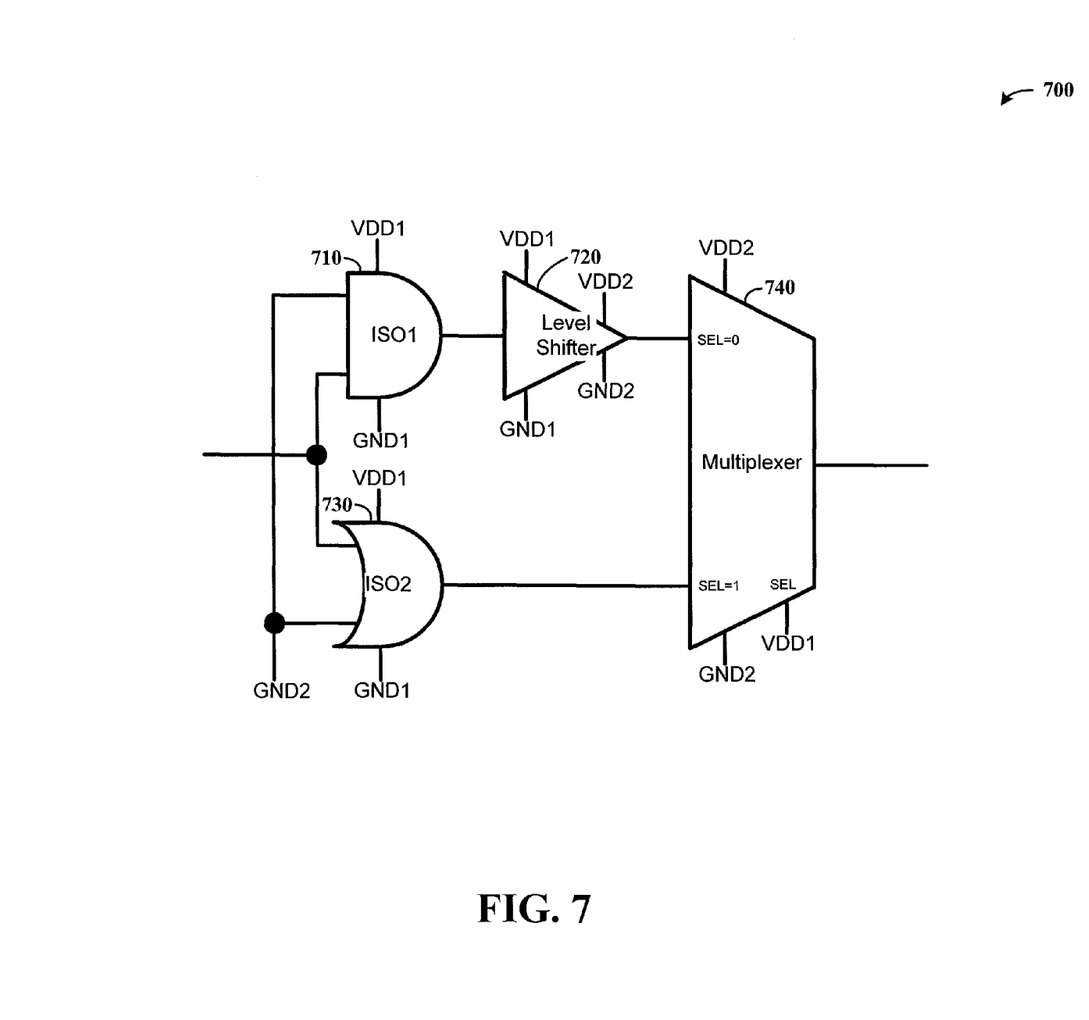
FIG. 7 shows an up-level shifter for a stacked power mode, in accordance with one or more embodiments.

FIG. 7 shows an up-level shifter 700 for a stacked power mode, in accordance with one or more embodiments. The up-level shifter 700 may, for example, be implemented in connection with the approach characterized in FIG. 3. For a stacked power mode, the voltage of GND2 and VDD1 are the same. An AND gate 710 provides an output to level shifter 720, which is output by multiplexer 740 under the stacked mode. An OR gate 730 operates to pass an output to the multiplexer 740 for a flat mode.

Figure 8:
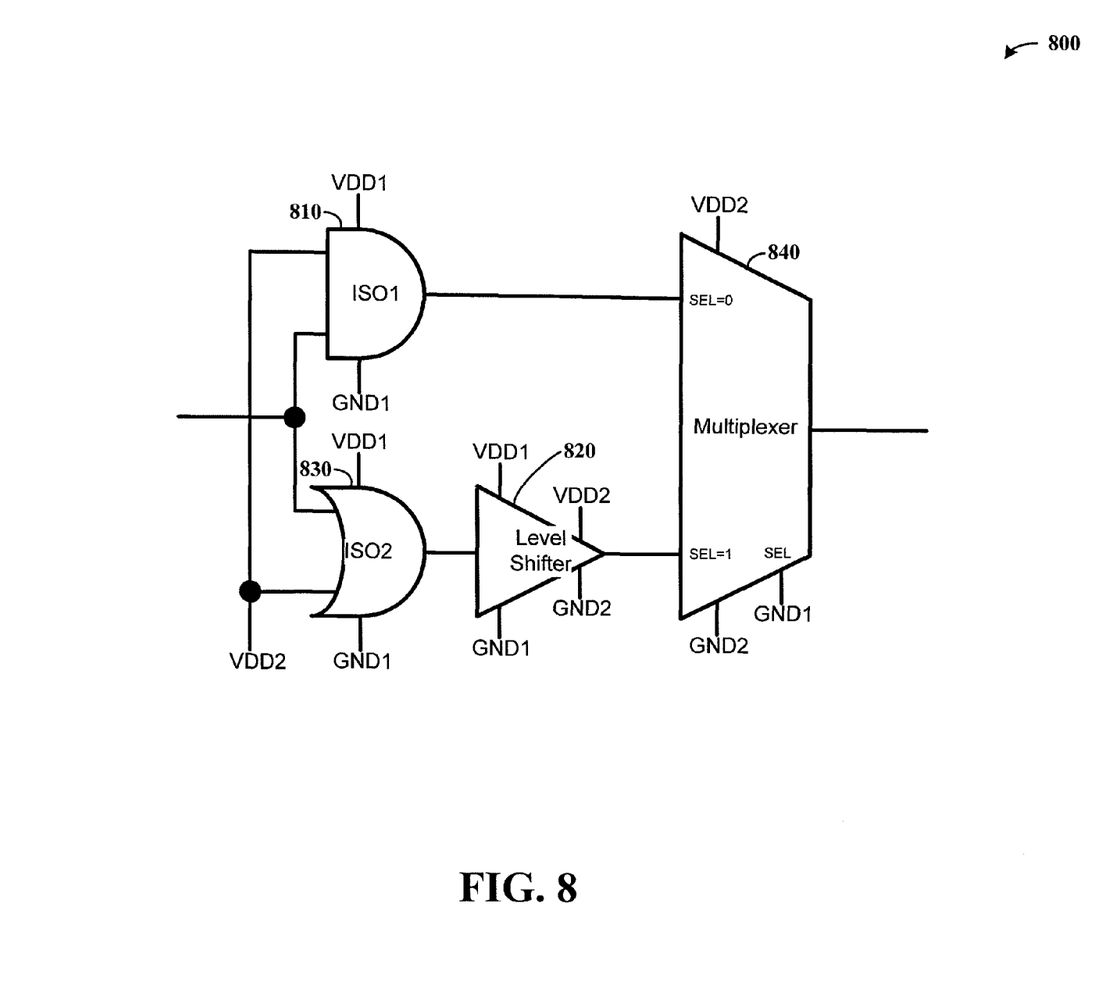
FIG. 8 shows a down-level shifter for a stacked power mode, in accordance with one or more embodiments.

FIG. 8 shows a down-level shifter 800, in accordance with one or more embodiments. The down-level shifter 800 may, for example, be implemented in connection with the approach characterized in FIG. 3. For the stacked power mode, the voltage of GND1 and VDD2 are the same. An OR gate 830 operates in a stacked mode to couple a signal to a level shifter 820, which provides an output to multiplexer 840 that selects the (down-shifted) output. An AND gate 810 operates in a flat mode to couple and output to the multiplexer 840.

Figure 9:
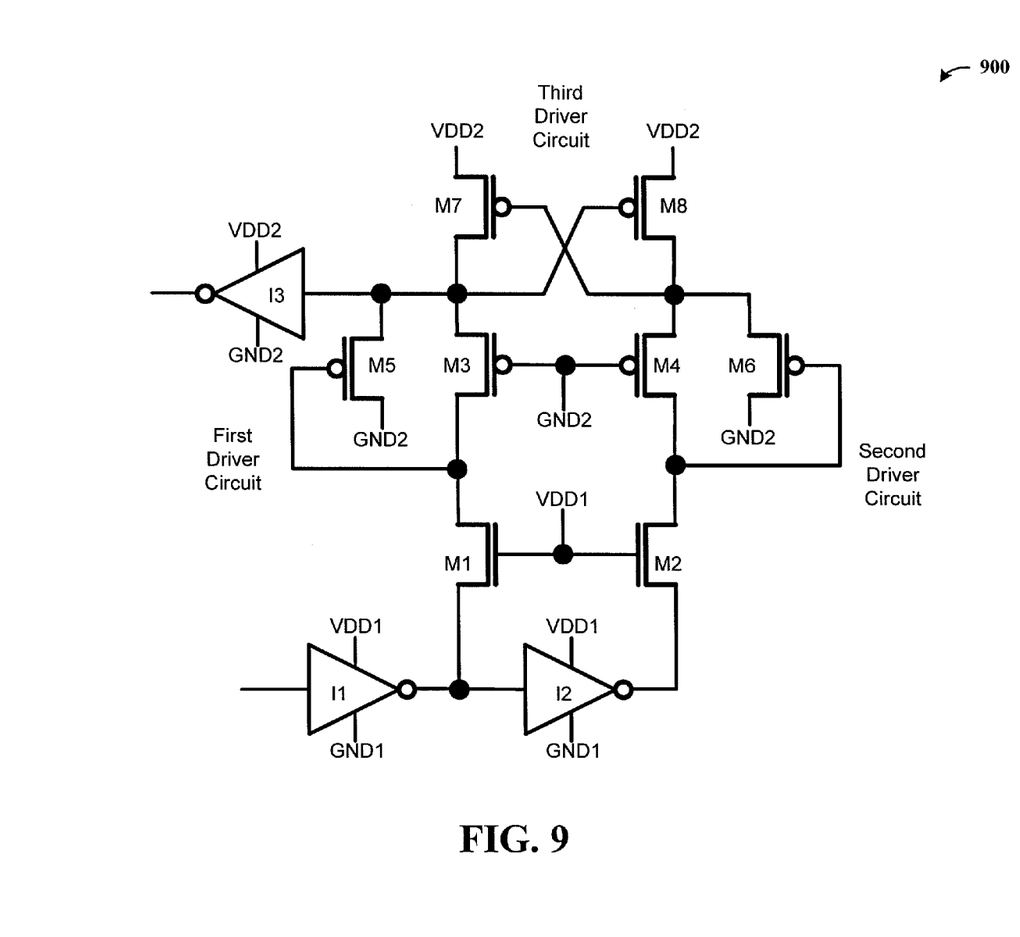
FIG. 9 shows an up-level shifter, in accordance with another embodiment.

FIG. 9 shows an up-level shifter 900, in accordance with another embodiment. In a stacked power mode, GND2 and VDD1 are the same. The up-level shifter 900 may, for example, be implemented in a manner similar to that of the level shifter apparatus 600 in FIG. 6. The above discussion of FIG. 6 may be generally applied in FIG. 9.

Figure 10:
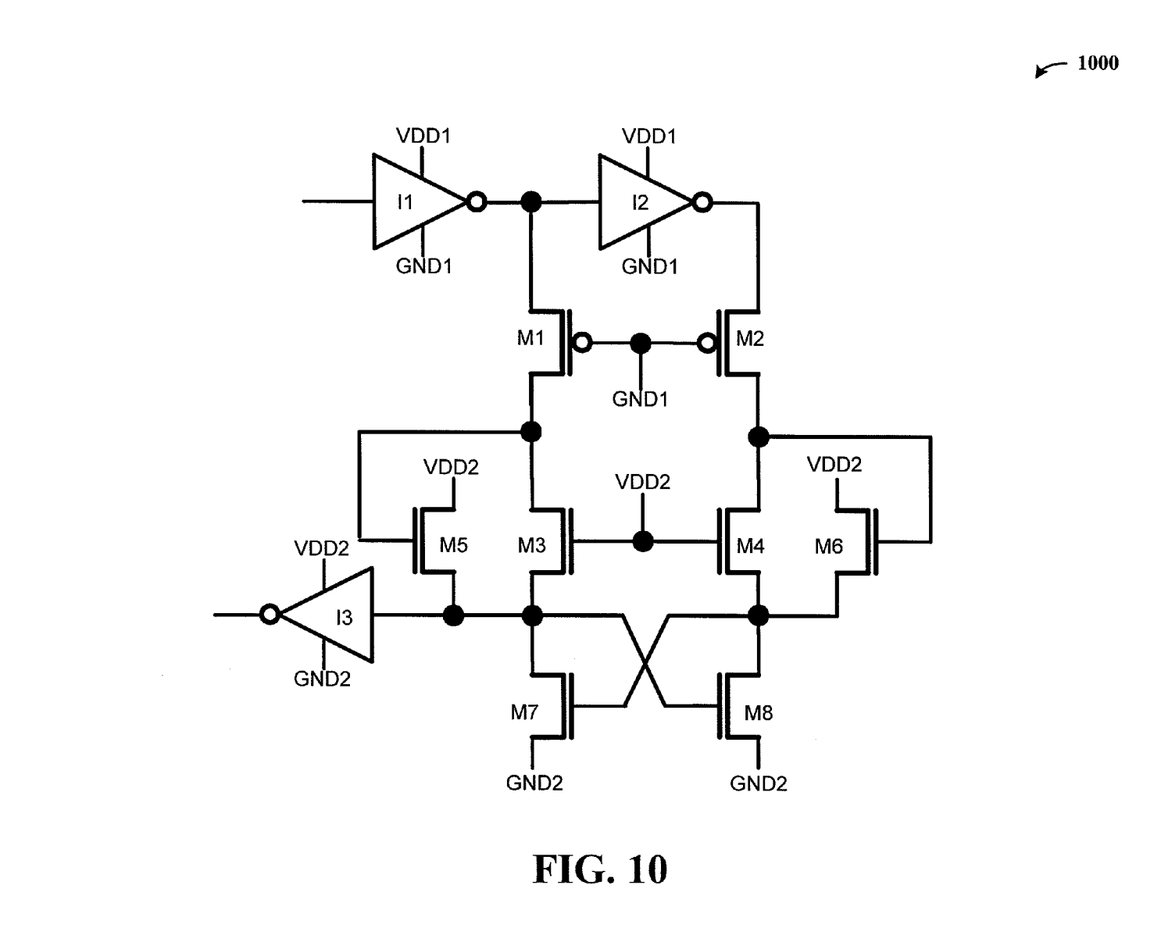
FIG. 10 shows a down-level shifter, in accordance with another example embodiment.

FIG. 10 shows a down-level shifter 1000, in accordance with another example embodiment. In a stacked power mode, the voltage of GND1 and VDD2 are the same. The down-level shifter 1000 may, for example, be implemented in a manner similar to that of the level shifter apparatus 600 in FIG. 6, or as a corollary to FIG. 9 (similarly shifting, but from high to low, rather than from low to high). The above discussion of FIG. 6 may be generally applied in FIG. 10.

Various blocks, modules or other circuits may be implemented to carry out one or more of the operations and activities described herein and/or shown in the figures. In these contexts, a "block" (also sometimes "circuit", "logic circuitry", or "module") can be implemented using a circuit that carries out one or more of these or related operations/activities. Such an approach can be used, for example, with blocks as shown in FIG. 1. In various embodiments, a hard-wired control block can be used for such an implementation. Alternatively and/or in addition, in certain of the above-discussed embodiments, one or more modules are discreet logic circuits or programmable logic circuits configured and arranged for implementing these operations/activities.

Based upon the above discussion and illustrations, those skilled in the art will readily recognize that various modifications and changes may be made to the various embodiments without strictly following the exemplary embodiments and applications illustrated and described herein. For example, in some embodiments additional power domains may be implemented, with more or fewer circuits operating for communicating signals there between. Various embodiments may be implemented in manners different than those illustrated by the figures. For instance, level-shifting may be carried out in a manner similar to that characterized in U.S. patent application Ser. No. 13/856,184. Such modifications do not depart from the true spirit and scope of various aspects of the invention, including aspects set forth in the claims.

What is claimed is:
1. An apparatus comprising:
a first circuit configured and arranged to operate under a first power domain having a first voltage range;

a second circuit configured and arranged to operate under a second power domain having a second voltage range; and
a level shifter circuit connected to the first circuit and to the second circuit, the level shifter circuit being configured and arranged to:
detect a voltage range of the first power domain,
detect a voltage range of the second power domain, and
provide communications between the first and second circuit by,
converting a voltage level of a first signal received from one of the first and second circuits to a different voltage level that corresponds to the first or the second voltage range of the other one of the first and second circuits in response to the detected voltage ranges of the first and second power domains being different, and thereafter communicating the first signal to the other one of the first and second circuits, and
communicating a second signal directly between the first and second circuits in response to the detected voltage ranges of the first and second power domains being the same.

2. The apparatus of claim 1, wherein the level shifter circuit is configured and arranged to:
in a first stacked mode, convert the voltage level of the first signal in response to the detected voltage ranges of the first and second power domains indicating that the first circuit operates between first and second voltage levels and that the second circuit operates between the second and a third voltage level, and
in a second flat mode, communicate the second signal directly between the first and second circuits without converting the voltage level of the second signal in response to the detected voltage ranges of the first and second power domains indicating that both the first and second circuits operate between common voltage levels.

3. The apparatus of claim 2, wherein the level shifter circuit includes:
a first circuit path coupled to receive the first signal, the first circuit path including a first comparison circuit and a voltage level shifting circuit configured and arrange to shift the voltage level of the first signal and to output the first signal with a shifted voltage level to the other one of the first and second circuits, the first comparison circuit being configured and arranged to pass the first signal to the voltage level shifting circuit in response to the detected voltage ranges being different, and
a second circuit path coupled to receive the second signal and including a second comparison circuit configured and arranged to output the second signal to the other one of the first and second circuits at a voltage level at which the second signal is received, in response to the detected voltage ranges of the first and second power domains being the same.

4. The apparatus of claim 3, further including a multiplexer having first and second inputs respectively connected to receive the outputs of the first and second circuit paths, the multiplexer being configured and arranged to:
provide an output signal based on the output of the first circuit path in response to the detected voltage ranges of the first and second power domains being different, and
provide an output signal based on the output of the second circuit path in response to the detected voltage ranges of the first and second power domains being the same.

5. The apparatus of claim 4, wherein each of the first circuit and the second circuit are respectively coupled between high and low voltage rails, further including interface circuit including a switching circuit and configured and arranged to:
in a first stack mode, couple the low voltage rail of the first circuit to the high voltage rail of the second circuit, and
in a second flat mode, couple the high voltage rail of the first circuit to the high voltage rail of the second circuit, and couple the low voltage rail of the first circuit to the low voltage rail of the second circuit.

6. The apparatus of claim 1, wherein each of the first circuit and the second circuit are respectively coupled between high and low voltage rails, further including a switching circuit configured and arranged to:
in a first power mode, couple the low voltage rail of the first circuit to the high voltage rail of the second circuit, and
in a second power mode, couple the high voltage rail of the first circuit to the high voltage rail of the second circuit, and couple the low voltage rail of the first circuit to the low voltage rail of the second circuit.

7. The apparatus of claim 1, wherein the level shifter circuit includes:
a range detection circuit configured and arranged to detect the voltage ranges of the first and second power domains,
a shift circuit configured and arranged to convert voltage levels of input signals, including the first and second signals,
a bypass circuit configured and arranged to provide the input signals, including the first and second signals, for passing between the first and second circuits at a common voltage level, and
a multiplexer configured and arranged to select an output of one of the shift circuit and the bypass circuit based on the voltage ranged detected by the range detection circuit.

8. The apparatus of claim 1, wherein
the first power domain operates between a first high voltage level and a first low voltage level that is lower than the first high voltage level,
the second power domain operates between a second high voltage level and a second low voltage level that is lower than the second high voltage level,
the level shifter circuit is configured and arranged to detect the voltage ranges of the first and second power domains by:
detecting that the first and second power domains operate over the same voltage rage in response to the first low voltage level being unequal to the second high voltage level, and
detecting that the first and second power domains operate over different voltage ranges shifted relative to one another in response to first low voltage level being equal to the second high voltage level.

9. The apparatus of claim 1, wherein at least one of the first circuit and the second circuit includes a memory circuit.

10. An apparatus comprising:
a first circuit configured and arranged to operate under a first power domain having a first voltage range;
a second circuit configured and arranged to operate under a second power domain having a second voltage range; and
an interface circuit connected to the first circuit and to the second circuit, the interface circuit being configured and arranged to:

in a first mode and responsive to the first voltage range being different than the second voltage range, convert a voltage level of a first signal passed between the first circuit and the second circuit, and in a second mode and responsive to the first and second circuits operating over a common voltage range, communicate a second signal directly between the first circuit and the second circuit, the second signal having a voltage level within the common voltage range.

11. The apparatus of claim 10, wherein the first circuit operates between a first high power rail and a first low power rail that operates at a voltage level that is lower than a voltage level of the first high power rail, the second circuit operates between a second high power rail and a second low power rail that operates at a voltage level that is lower than a voltage level of the second high power rail, and the interface circuit is configured and arranged to:

in a first mode, couple the first low power rail to the second high power rail, thereby recycling power from the first circuit into the second circuit, and in a second mode, couple the first high power rail to the second high power rail, and couple the first low power rail to the second low power rail, thereby operating the first circuit and the second circuit over a common voltage range.

12. The apparatus of claim 10, wherein the interface circuit further includes a level shifter circuit, wherein the interface circuit and the level shifter circuit are configured and arranged to:

in the first mode, convert the voltage level of the first signal, in response to the first circuit operating between first and second voltage levels and the second circuit operating between the second voltage level and a third voltage level, the second voltage level being between the first and third voltage levels, and in the second mode, communicate the second signal, directly between the first and second circuits without converting a voltage level of the second signal in response to the both the first and second circuits operating over a common voltage range.

13. The apparatus of claim 12, wherein the interface circuit includes:

a first circuit path coupled to receive the first signal as communicated from one of the first and second circuits, the first circuit path including a first comparison circuit and a voltage level shifting circuit configured and arranged to output the first signal with a shifted voltage level to the other one of the first and second circuits, and a second circuit path coupled to receive the second signal as communicated from one of the first and second circuits, and including a second comparison circuit configured and arranged to output the second signal to the other one of the first and second circuits at a voltage level at which the second signal is received.

14. The apparatus of claim 13, wherein the interface circuit is configured and arranged to:

output the first signal with a shifted voltage level in response to the first and second voltage ranges being different, and output the second signal at a voltage level at which the second signal are received in response to the first and second voltage ranges of the first and second power domains being the same.

15. A method comprising:

detecting a voltage range of a first power domain and detecting a voltage range of a second power domain, with a first circuit operating under the first power domain having a first voltage range and a second circuit operating under the second power domain having a second voltage range, in a first mode, converting a voltage level of a first signal as communicated between the first circuit and the second circuit in response to the detected voltage ranges of the first and second power domains being different using a level shifter circuit, and in a second mode, communicating a second signal directly between the first circuit and the second circuit at a common voltage level.

16. The method of claim 15, wherein communicating the second signal directly between the first and second circuits includes passing the second signal directly in response to the detected voltage ranges of the first and second power domains being the same.

17. The method of claim 16, wherein the voltage range of the first power domain is between a first low voltage and a first high voltage, and the voltage range of the second power domain is between a second low voltage and a second high voltage that is equal to the first low voltage, and converting the voltage level includes recycling charge from the first circuit and using the recycled charge to power the second circuit and level-shifting the first signal from the first voltage range to the second voltage range by passing the first signal received from the first circuit through a level shifter circuit and providing an output of the level shifter circuit to the second circuit.

18. The method of claim 17, wherein communicating the second signal directly between the first and second circuits includes bypassing the level shifter circuit, thereby facilitating rapid transfer of the second signal from the first circuit to the second circuit.

19. The method of claim 16, wherein:

converting the voltage level of the first signal includes
communicating the first signal, received from a first one of the first and second circuits, through a first circuit path having a first comparison circuit and having a voltage level shifting circuit that shifts a voltage level of the first signal, outputting the first signal with a shifted voltage level to the other one of the first and second circuits, and communicating the second signal directly between the first and second circuits includes passing the second signal, received from the first one of the first and second circuits, through a second circuit path that bypasses the voltage level shifting circuit.

20. The method of claim 19, further including multiplexing outputs of the first circuit path and the second circuit path by:

providing an output signal based on the output of the first circuit path in response to the detected voltage ranges of the first and second power domains being different, and providing an output signal based on the output of the second circuit path in response to the detected voltage ranges of the first and second power domains being the same.

* * * * *